(12) United States Patent
Rasa

(10) Patent No.: US 9,456,502 B2
(45) Date of Patent: Sep. 27, 2016

(54) METHOD FOR EJECTING MOLTEN METALS

(71) Applicant: OCE-TECHNOLOGIES B.V., Venlo (NL)

(72) Inventor: Mircea V. Rasa, Venlo (NL)

(73) Assignee: OCE-TECHNOLOGIES B.V., Venlo (NL)

( * ) Notice: Subject to any disclaimer, the term of this patent is extended or adjusted under 35 U.S.C. 154(b) by 0 days.

(21) Appl. No.: 14/794,509

(22) Filed: Jul. 8, 2015

(65) Prior Publication Data

US 2016/0021760 A1    Jan. 21, 2016

(30) Foreign Application Priority Data

Jul. 16, 2014  (EP) .................................. 14177314

(51) Int. Cl.
| | |
|---|---|
| *H05K 3/12* | (2006.01) |
| *B05B 5/057* | (2006.01) |
| *B05B 17/04* | (2006.01) |
| *C23C 4/06* | (2016.01) |
| *C23C 4/10* | (2016.01) |
| *B41J 2/04* | (2006.01) |

(52) U.S. Cl.
CPC ............. *H05K 3/1241* (2013.01); *B41J 2/04* (2013.01); *B41J 2002/041* (2013.01); *H05K 2203/0736* (2013.01)

(58) Field of Classification Search
CPC .................. H05K 3/1241; H05K 2203/0736; B41J 2/04; B41J 2202/041; B05B 5/001; B05B 5/057; B05B 5/165; B05B 17/04; B23K 3/06; B23K 3/0623; B23K 3/0607; C23C 4/06; C23C 4/067; C23C 4/08; C23C 4/10

USPC .............. 239/1, 4, 11, 13, 82, 135, 690; 222/590–594; 427/96.1, 98.4, 99.2, 427/598
See application file for complete search history.

(56) References Cited

U.S. PATENT DOCUMENTS

| | | | | |
|---|---|---|---|---|
| 4,919,335 | A * | 4/1990 | Hobson | C23C 4/123 239/3 |
| 5,261,611 | A * | 11/1993 | Huxford | B05B 5/00 222/594 |
| 5,377,961 | A * | 1/1995 | Smith | B23K 3/06 222/590 |
| 5,876,615 | A * | 3/1999 | Predetechensky | B05B 5/025 222/590 |
| 6,202,734 | B1 * | 3/2001 | Sackinger | B22F 3/115 164/271 |
| 2006/0102663 | A1 * | 5/2006 | McGeoch | B22D 39/003 222/591 |
| 2011/0233239 | A1 * | 9/2011 | Rasa | B22F 9/082 222/591 |

FOREIGN PATENT DOCUMENTS

| | | |
|---|---|---|
| EP | 0 361 709 A1 | 4/1990 |
| EP | 2 719 791 A1 | 4/2014 |
| GB | 2 172 900 A | 10/1986 |
| WO | WO 2010/063576 A1 | 6/2010 |

* cited by examiner

*Primary Examiner* — Darren W Gorman
(74) *Attorney, Agent, or Firm* — Birch, Stewart, Kolasch & Birch, LLP

(57) ABSTRACT

The present invention relates to a method for ejecting droplets of a molten metal. In the present invention, the metal is a composition comprising a first metal and a second element, wherein the second element is Si. In jetting operation, the second elements may prevent contaminants present in the composition from precipitating and clogging the orifice. The present invention further relates to the use of such composition.

9 Claims, 1 Drawing Sheet

METHOD FOR EJECTING MOLTEN METALS

The present invention relates to a method for jetting molten metals. The present invention further relates to the use of a composition comprising a first metal and a second element for ejecting droplets of a molten metal.

BACKGROUND OF THE INVENTION

A jetting device for ejecting droplets of a molten metal is known. An example of a jetting device for ejecting droplets of a molten metal is described in WO 2010/063576 A1. In such a printing device, a Lorentz force is generated in the molten metal due to which a droplet is expelled through an orifice of the printing device. Such a device may be used to eject droplets of a molten metal at a high temperature. Hence, using such device, metals having a high melting point, such as silver, gold and copper can be jetted. Direct printing of molten metals may be employed for printing electronic circuitry, for example. In such an application it is essential that all droplets are actually printed accurately as otherwise the electronic circuitry may not function due to an interruption in the electronic connections as a result of a missing droplet, for example. Ejection of a droplet may be hampered in case an orifice is blocked. An orifice that is blocked contains solid material that is deposited in and/or around the orifice. The solid material may comprise e.g. contaminants present in the metal. When an orifice is blocked, it may be more difficult or even impossible to eject a droplet of fluid from the orifice. As a consequence, a decrease in the jetting stability may therefore result in missing droplets. It is therefore desirable to prevent the orifice from becoming blocked.

Therefore, it is an object of the invention to provide a method that prevents blocking of the orifice.

SUMMARY OF THE INVENTION

It has been found that blocking of the orifice can be prevented or at least delayed by applying a method for ejecting droplets of a molten metal composition, the molten metal composition being positioned in a fluid chamber body, the fluid chamber body forming a fluid chamber for holding an amount of the molten metal composition, the fluid chamber body comprising an orifice, the orifice being in communication with the fluid chamber, the method comprising the steps of:
 a) providing a magnetic field to at least part of the molten metal composition positioned in the fluid chamber;
 b) providing an electrical current in the part of the molten metal composition positioned in the magnetic field, thereby generating a Lorentz force in the molten metal composition;
wherein the molten metal composition is a composition comprising a first molten metal and a second element, wherein the second element is silicon (Si).

In a known system for printing a molten metal composition, a droplet of said metal composition is expelled through an orifice by a Lorentz force. This force causes a motion in the metal. This motion may cause a part of the molten metal to move from the fluid chamber through the orifice, thereby generating a droplet of the molten metal. The Lorentz force is related to the electric current and the magnetic field vector; $\vec{F}=\vec{I}\times\vec{B}$.

The Lorentz force resulting from the electric current and the magnetic field is generated in a direction perpendicular to both the electrical current and the magnetic field. By suitably selecting the direction and the magnitude of the electric current, as well as the direction and the magnitude of the magnetic field, the direction and the magnitude of the resulting Lorentz force may be selected. In the system according to the present invention, in normal operation, the magnetic field is provided and an electrical current is provided in the molten metal composition, such that a suitable force for ejecting a droplet is generated.

The jetting device in accordance with the present invention comprises a fluid chamber and has an orifice extending from the fluid chamber to an outer surface of the fluid chamber element. In operation, the fluid chamber comprises a molten metal composition.

When applying an actuation pulse, a Lorentz force is generated within the metal, causing the molten metal composition to move through the orifice in a direction away from the fluid chamber. The actuation pulse may be applied by applying a pulsed magnetic field and a continuous electrical current, or a pulsed electrical current in a continuous magnetic field, or a combination thereof. Alternatively, a constant Lorentz force may be generated within the metal by applying a constant electrical current to the electrically conductive fluid in a constant magnetic field. However, application of a constant Lorentz force to the molten metal composition may result in the ejection of a stream of the electrically conductive fluid, instead of in the ejection of droplets.

The jetting device may be positioned in an inert atmosphere, for example an inert gas such as nitrogen or a noble gas. By using an inert atmosphere, oxidation of the metal by reacting with oxygen from the air may be prevented and hence, the rate of oxidation of the metal may be decreased. However, it was found that, even if an inert atmosphere is applied, still oxidation of the metal and of impurities in the metal may occur.

To prevent problems relating to precipitation of contaminants present in the system, or precipitation of oxides of the metal or impurities present in the system, a molten metal composition is used, wherein the composition comprises at least a first metal and a second element, wherein the selected element is silicon (Si). The first metal may be the principle metal; i.e. the metal to be applied onto a recording medium.

Surprisingly, it was found that addition of the second element, wherein the second element is silicon (Si), reduces the amount of solid precipitation formed during the jetting process. Reducing the amount of solid precipitation during the jetting process may decrease the chances of nozzle clogging during the jetting process and may therefore improve the stability of the jetting process.

Without wanting to be bound to any theory, it is believed that the second element, wherein the second element is silicon (Si), results in the formation of a glass-like composition having a low melting point; i.e. a glass-like composition being in the liquid state at the jetting temperature. The second element may form the glass-like composition with contaminants present in the molten metal composition. Contaminants that may be present in the molten metal composition are e.g. Al, Mg, Ca and Ba. These elements—or their oxides—may form precipitants that may cause nozzle clogging.

Adding silicon (Si) to the molten metal composition may result in the formation of a glass-like composition comprising at least one of the at least one second element and comprising the contaminant. The glass-like compositions may have a melting point of about 600° C., which is well below the melting point of metals such as copper, silver and gold. Hence, when jetting such metals, the glass-like compositions will stay liquid and may be removed from the jetting device with the ejected droplets. Because these glass-like compositions may stay in the liquid phase, no solid precipitations that may clog the nozzle may be formed. Hence, nozzle clogging may be prevented.

Further, a metal composition comprising the first metal and silicon may have better wetting properties than the first metal (not comprising silicon). The molten metal composition according to the invention may efficiently wet surfaces. For example, the molten metal composition may efficiently wet the inner surface of the nozzle. Good wetting of the nozzle by the metal composition to be jetted may decrease the tendency of contaminants to stick to the inner nozzle surface. Hence, using a molten metal composition which comprises silicon in addition to the metal to be jetted (first metal), blocking of the nozzle may be prevented or at least diminished, thereby improving the jetting stability.

In an embodiment, the temperature of the molten metal composition in the fluid chamber is at least 600° C. Metals generally have a high melting point. In order to eject droplets of a molten metal using Lorentz actuation, the metal may need to be in a fluid phase. Generally, metals have a high melting point. For example, the melting point of silver is 962° C., the melting point of copper is 1085° C. and the melting point of gold is 1064° C. Hence, in order to suitably eject droplets of a molten fluid, the temperature of the molten metal in the fluid chamber may be such that the metal to be jetted is in a molten state. The temperature of the molten metal in the fluid chamber is preferably at least 600° C., more preferably at least 700° C., even more preferably at least 900° C., for example at least 1100° C.

In an embodiment, the first molten metal is selected from the group consisting of copper, silver and gold. Metals are materials that in general have a good electric conductivity. For example, ejecting droplets of a molten metal may be used to print electronic circuits. By applying a printing technique to apply droplets of metal onto a recording medium, electronic circuits may be printed in a versatile way; i.e. the shape of the circuit may be easily adapted for the respective electronic circuits. Silver, gold and copper may be usefully applied in electronic devices, for example as electrodes. By applying an image of silver, copper or an alloy thereof onto a recording medium, electrically conductive parts, such as electrodes, may be efficiently applied onto the recording medium.

In a further embodiment, the first molten metal is silver. As mentioned above, silver may be usefully applied in a jetting process to manufacture electrically conductive parts. Use of silver is preferred, for example because of its suitability for solar applications. The wetting properties of fluid silver may improve when silicon is added.

In an embodiment, the molten metal composition further comprises sodium (Na). Adding both silicon and sodium to the first metal may result in the formation of a metal composition, wherein in jetting operation, formation of solid precipitants may be even further reduced. Hence, using molten metal composition that comprises both silicon and sodium may show even further improved jetting stability.

In a further embodiment, the molten metal composition further comprises tin (Sn). Without wanting to be bound to any theory, it is believed that adding silicon, sodium and tin to the metal to be jetted may result in the formation of a glass-like composition, the glass-like composition comprising at least one contaminant present in the molten metal composition, and comprising silicon, sodium and tin. In addition, it is believed that—in case oxygen is present—tin may be selectively oxidized, thereby preventing oxidation of the first metal.

In an alternative embodiment, the molten metal composition may further comprise iron (Fe). Iron is more easily oxidized than metals such as copper, silver, gold and platinum. In case oxygen is present in the metal composition, iron will be selectively oxidized, thereby preventing oxidation of the first metal.

In an embodiment, the first molten metal is present in an amount of 70 wt % or higher based on the total amount of molten metal. In the method according to the present invention, the molten metal composition comprises a first metal and a second element. The second element may from a liquid composition, such as a glass-like composition with contaminants present in the system. Because of the presence of the second element, the contaminant may not precipitate, thereby blocking the nozzle, but may stay in the liquid phase. The liquid contaminant, which may be present in small quantities only, may therefore be removed from the system upon ejecting droplets of the metal composition. Depending on the area of application, the purity of the metal to be jetted may be selected. For example, the alloy may comprise the first metal in an amount of 70 wt % or more based on the total amount of alloy. Preferably, the alloy may comprise the first metal in an amount of 80 wt % or more based on the total amount of alloy. For example, the alloy may comprise the first metal in an amount of from 85 wt %-99.99 wt % based on the total amount of alloy, such as from 88 wt %-99.7 wt % based on the total amount of alloy, for example, 90 wt %-97 wt % based on the total amount of alloy.

In an embodiment, the second element is present in an amount of 3 wt % or less, based on the total amount of molten metal composition. Depending on the area of application, the purity of the metal to be jetted may be selected. When a high purity metal is required, only a low amount of the second element may be present in the alloy. The amount of the at least one of second element may be selected based on the first metal used and on the type and amount of impurities present in the first metal. For example, the alloy may comprise the second metal in an amount of 2 wt % or less based on the total amount of alloy. Preferably, the alloy may comprise the second metal in an amount of 1 wt % or less based on the total amount of alloy. For example, the alloy may comprise the second metal in an amount of from 0.005 wt %-0.7 wt % based on the total amount of alloy, such as from 0.01 wt %-0.5 wt % based on the total amount of alloy, for example, 0.1 wt %-0.3 wt % based on the total amount of molten metal composition.

In an aspect of the invention, use of a metal composition for ejecting droplets of a molten metal is provided, wherein the molten metal composition comprises a first metal and a second element, wherein the second element is silicon (Si).

As described above, such composition can be suitably used in a process for ejecting droplets of a metal composition. Use of such composition may increase the stability of the jetting process.

In an embodiment, the metal composition comprises a first metal and a second element, wherein the first metal is silver and the second element is silicon. A composition comprising silver and silicon may be suitably used in a process for ejecting droplets of metal, wherein the droplets comprise silver.

BRIEF DESCRIPTION OF THE DRAWINGS

These and further features and advantages of the present invention are explained hereinafter with reference to the accompanying drawings showing non-limiting embodiments and wherein.

In the drawings, same reference numerals refer to same elements.

DETAILED DESCRIPTION OF THE DRAWINGS

Figure 1:
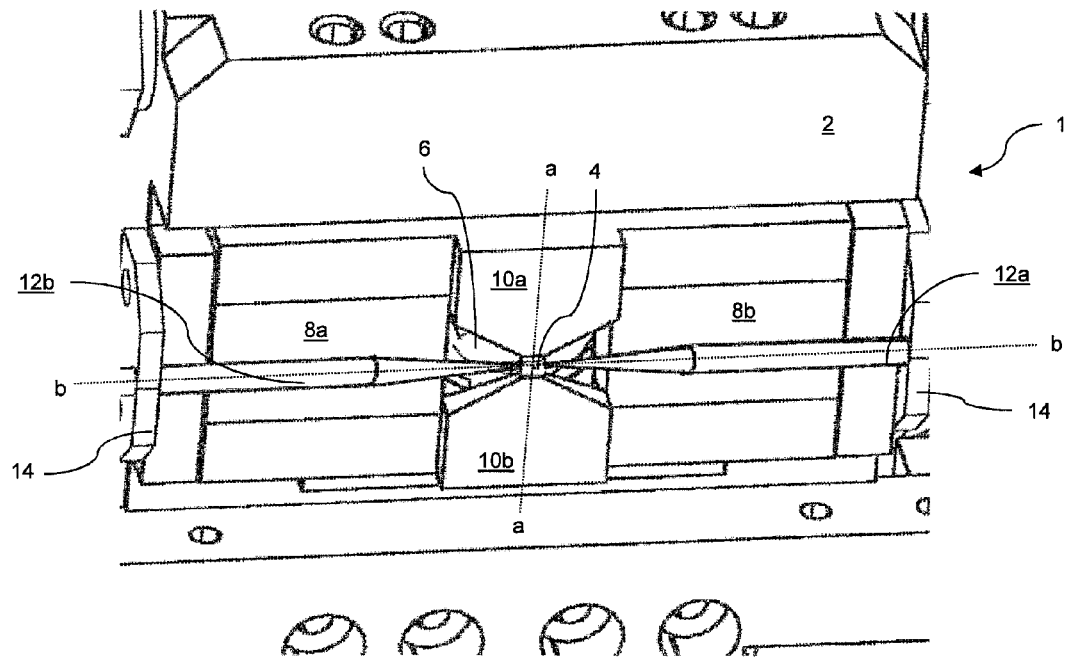
FIG. 1 shows a perspective view of a printing device for printing droplets of an electrically conductive fluid.

FIG. 1 shows a part of a jetting device 1 for ejecting droplets of a relatively hot fluid, in particular a molten metal such as copper, silver, gold and the like. The jetting device 1 comprises a support frame 2, made of a heat resistant and preferably heat conductive material.

The jetting device 1 is provided with an ejection nozzle 4 through which a droplet of the fluid may be ejected. The nozzle or orifice 4 is a through hole extending through a wall of a fluid chamber body 6. In the fluid chamber body 6 a fluid chamber is arranged. The fluid chamber is configured to hold the fluid. For ejecting droplets of molten metal, the jetting device 1 is provided with two permanent magnets 8a, 8b (hereinafter also referred to as magnets 8). The magnets 8 are arranged between two magnetic field concentrating elements 10a, 10b (hereinafter also referred to as concentrators 10) made of magnetic field guiding material such as iron. The jetting device 1 is further provided with two electrodes 12a, 12b (hereinafter also referred to as electrodes 12) both extending into the fluid chamber body 6 through a suitable through hole such that at least a tip of each of the electrodes 12 is in direct electrical contact with the molten metal present in the fluid chamber. The electrodes 12 are supported by suitable electrode supports 14 and are each operatively connectable to a suitable electrical current generator (not shown) such that a suitable electrical current may be generated through the electrodes 12 and the molten metal present between the tips of the electrodes 12.

Figure 2:
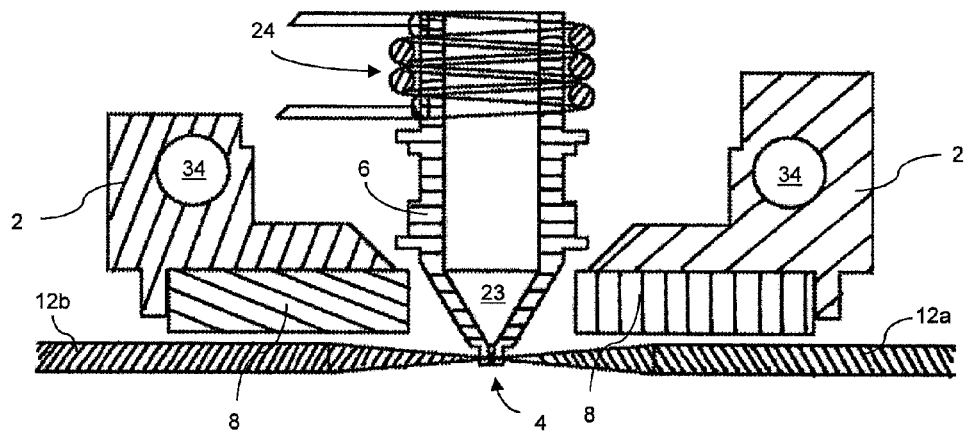
FIG. 2 shows a cross-sectional view of a part of the printing device shown in FIG. 1.

FIG. 2 shows a cross-section of the embodiment illustrated in FIG. 1, which cross-section is taken along line b-b (FIG. 1). Referring to FIG. 2, the support frame 2 and the magnets 8 are shown. In the illustrated embodiment, the support frame 2 is provided with cooling channels 34 through which a cooling liquid may flow for actively cooling of the support frame 2 and the magnets 8. An induction coil 24 is shown. The fluid chamber body 6 is arranged in a centre of the induction coil 24 such that a current flowing through the induction coil 24 results in heating of a metal arranged in the fluid chamber 6. Due to such heating the metal may melt and thus become a fluid. Such inductive heating ensures a power-efficient heating and no contact between any heating element and the fluid, limiting a number of (possible) interactions between elements of the jetting device 1 and the fluid. Nevertheless, in other embodiments, other means for heating the metal in the fluid chamber may be applied.

Detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually and appropriately detailed structure. In particular, features presented and described in separate dependent claims may be applied in combination and any combination of such claims are herewith disclosed. Further, the terms and phrases used herein are not intended to be limiting; but rather, to provide an understandable description of the invention. The terms "a" or "an", as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly.

The invention claimed is:

1. A method for ejecting droplets of a molten metal composition, the molten metal composition being positioned in a fluid chamber body, the fluid chamber body forming a fluid chamber for holding an amount of the molten metal composition, the fluid chamber body comprising an orifice, the orifice being in communication with the fluid chamber, the method comprising the steps of:
   a) providing a magnetic field to at least part of the molten metal composition positioned in the fluid chamber; and
   b) providing an electrical current in the part of the molten metal composition positioned in the magnetic field, thereby generating a Lorentz force in the molten metal composition,
   wherein the molten metal composition is a composition comprising a first molten metal and a second element, wherein the second element is silicon (Si).

2. The method according to claim 1, wherein the temperature of the molten metal composition in the fluid chamber is at least 600° C.

3. The method according to claim 1, wherein the first molten metal is selected from the group consisting of copper, silver and gold.

4. The method according to claim 3, wherein the first molten metal is silver.

5. The method according to claim 1, wherein the molten metal composition further comprises sodium (Na).

6. The method according to claim 5, wherein the molten metal composition further comprises tin (Sn).

7. The method according to claim 1, wherein the molten metal composition further comprises iron (Fe).

8. The method according to claim 1, wherein the first molten metal is present in an amount of 70 wt % or higher based on the total amount of molten metal.

9. The method according to claim 1, wherein the second element is present in an amount of 3 wt % or less, based on the total amount of molten metal.

* * * * *